United States Patent
Mimura

(10) Patent No.: US 7,564,061 B2
(45) Date of Patent: Jul. 21, 2009

(54) FIELD EFFECT TRANSISTOR AND PRODUCTION METHOD THEREOF

(75) Inventor: Takashi Mimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 107 days.

(21) Appl. No.: 11/058,251

(22) Filed: Feb. 16, 2005

(65) Prior Publication Data

US 2006/0081947 A1    Apr. 20, 2006

(30) Foreign Application Priority Data

Sep. 28, 2004  (JP)  ............................. 2004-282235

(51) Int. Cl.
*H01L 29/72* (2006.01)
(52) U.S. Cl. .................. 257/76; 257/288; 257/368; 257/382; 257/407; 257/765
(58) Field of Classification Search ........... 257/412, 257/377, 384, 76, 288, 351, 368, 382, 388, 257/407, 616, 765, 766, 768
See application file for complete search history.

(56) References Cited

U.S. PATENT DOCUMENTS

| | | | |
|---|---|---|---|
| 6,887,747 B2 | 5/2005 | Yagishita et al. | ............. 438/197 |
| 6,891,234 B1* | 5/2005 | Connelly et al. | ............. 257/407 |
| 2005/0051851 A1* | 3/2005 | Chen et al. | ................... 257/369 |
| 2005/0064636 A1* | 3/2005 | Cabral et al. | ................. 438/184 |
| 2006/0038234 A1* | 2/2006 | Liaw | ........................... 257/368 |
| 2006/0118875 A1* | 6/2006 | Nakagawa et al. | .......... 257/351 |

FOREIGN PATENT DOCUMENTS

| | | |
|---|---|---|
| JP | 55-015263 | 2/1980 |
| JP | 2000-22139 | 1/2000 |
| JP | 2002-011613 | 1/2002 |
| JP | 2002-94058 | 3/2002 |
| JP | 2002-118175 | 4/2002 |

OTHER PUBLICATIONS

Office Action of Japan Patent Appln. No. 2004-282235 dated Oct. 30, 2007.

* cited by examiner

*Primary Examiner*—Edward Wojciechowicz
(74) *Attorney, Agent, or Firm*—Kratz, Quintos & Hanson, LLP

(57) ABSTRACT

A field effect transistor having a gate, a source, and a drain formed from metallic materials is disclosed that is able to supply a high driving current. In the field effect transistor, a source region, a drain region and a gate electrode are formed from silicide or other metallic materials. The metallic materials are selected so that in an n-channel MISFET, the work function Wg of the gate electrode and the work function Wg of the source region satisfy the relation of Wg<Ws, and in a p-channel MISFET, work functions of the gate electrode and the source region satisfy the relation of Wg>Ws.

19 Claims, 6 Drawing Sheets

11 SOURCE REGION | 14 CHANNEL REGION

11 SOURCE REGION | 14 CHANNEL REGION

FIELD EFFECT TRANSISTOR AND PRODUCTION METHOD THEREOF

CROSS-REFERENCE TO RELATED APPLICATION

This patent application is based on Japanese Priority Patent Application No. 2004-282235 filed on Sep. 28, 2004, the entire contents of which are hereby incorporated by reference.

BACKGROUND OF THE INVENTION

1. Field of the Invention

The present invention generally relates to a field effect transistor and a method of producing the field effect transistor, and more particularly, to a field effect transistor having a metallic gate, a metallic source, and a metallic drain.

2. Description of the Related Art

Recently an MOS LSI is being increasingly miniaturized while complying with the so-called scaling rule and is highly integrated. As a result of this, the degree of integration of the LSI is increasing four fold every three years, and in 2004, it was attempted to fabricate an LSI having a gate length of 90 nm. With a MOS LSI being highly miniaturized and thus highly integrated, the circuit can operate at a higher speed, whereas power consumption of each circuit decreases. Because of these advantages, miniaturization of the LSI at a higher level is being developed.

An MOS LSI is constituted by field effect transistors (FET), in each of which a pn junction is formed between source and drain regions, acting as electrodes for supplying a current, and a channel region due to implantation of a trivalent or pentavalent impurity into a silicon substrate.

With an MOS LSI being highly miniaturized, problems occur, such as a short channel effect, or increase of stray capacitance. To eliminate these problems, it is required to form more miniaturized impurity regions such as extension regions or pocket regions. However, with an MOS LSI being highly miniaturized, it becomes more and more difficult to form and control miniaturized impurity diffusion regions because of the difficulty in implantation position control and thermal diffusion control in the highly miniaturized MOS LSI. As a result, yields of FETs and LSIs degrade.

To solve this problem, a field effect transistor is proposed to have a metallic gate, a metallic source and a metallic drain instead of the impurity diffusion regions. In such a field effect transistor, as the source and drain are formed from metallic materials, it is easy to control positions of the source and drain, and the source and drain regions essentially do not change in the later fabrication steps. Hence, it is easy to make a design, and it may also help realize position control at the atomic level.

For example, Japanese Laid-Open Patent Application No. 2002-118175 and Japanese Laid-Open Patent Application No. 2000-22139 disclose techniques in this field.

In the field effect transistor having metallic source and drain regions, however, because the source and drain regions directly contact a channel region in a silicon substrate, a Shottky barrier can be formed as a result of metal-semiconductor contact, which prevents injection of carriers into the channel region. For example, in an n-channel FET, a Shottky barrier may be formed between the metallic source and the channel region, and this barrier prevents injection of electrons into the channel region. As a result, electrons cannot be injected into the channel region at a high concentration, and sufficiently high driving current cannot be obtained.

SUMMARY OF THE INVENTION

It is a general object of the present invention to solve one or more of the problems of the related art.

It is a more specific object of the present invention to provide a field effect transistor having a gate, a source, and a drain formed from metallic materials that is able to supply a high driving current, and a method of producing the field effect transistor.

According to a first aspect of the present invention, there is provided a field effect transistor forming an n-channel field effect transistor, comprising a channel region formed from a semiconductor material; a gate insulating film covering the channel region; a gate electrode covering the gate insulating film, the gate electrode being formed from a first metallic material; a source region directly contacting a side of the channel region, the source region being formed from a second metallic material; and a drain region directly contacting another side of the channel region, the drain region being formed from a third metallic material, wherein a work function Wg of the first metallic material and a work function Ws of the second metallic material satisfies: Wg<Ws.

Preferably, each of the first metallic material, the second metallic material, and the third metallic material is formed from one of a metal, an alloy, and a conductive intermetallic compound.

According to the present invention, the height of a barrier against electrons at an interface between the source region and the channel region can be lowered, and electrons can be injected into the channel region at a high concentration, therefore, it is possible to increase an electron driving current.

According to a second aspect of the present invention, there is provided a field effect transistor forming a p-channel field effect transistor, comprising a channel region formed from a semiconductor material; a gate insulating film covering the channel region; a gate electrode covering the gate insulating film, the gate electrode being formed from a first metallic material; a source region directly contacting a side of the channel region, the source region being formed from a second metallic material; and a drain region directly contacting another side of the channel region, the drain region being formed from a third metallic material, wherein a work function Wg of the first metallic material and a work function Ws of the second metallic material satisfies: Wg>Ws.

According to the present invention, the height of a barrier against holes at an interface between the source region and the channel region can be lowered, and holes can be injected into the channel region at a high concentration, therefore, it is possible to increase a hole driving current.

According to a third aspect of the present invention, there is provided a field effect transistor forming a complementary field effect transistor, comprising: an n-channel field effect transistor; and a p-channel field effect transistor. The n-channel field effect transistor includes a channel region formed from a semiconductor material; a gate insulating film covering the channel region; a gate electrode covering the gate insulating film, said gate electrode being formed from a first metallic material; a source region directly contacting a side of the channel region, said source region being formed from a second metallic material; and a drain region directly contacting another side of the channel region, said drain region being formed from a third metallic material, wherein a work function Wg of the first metallic material and a work function Ws of the second metallic material satisfies: Wg<Ws. The p-channel field effect transistor includes a channel region formed from a semiconductor material; a gate insulating film covering the channel region; a gate electrode covering the gate insulating film, said gate electrode being formed from a first metallic material; a source region directly contacting a side of the channel region, said source region being formed from a second metallic material; and a drain region directly contacting another side of the channel region, said drain region being formed from a third metallic material; wherein a work function Wg of the first metallic material and a work function Ws of the second metallic material satisfies Wg>Ws.

According to a fourth aspect of the present invention, there is provided a field effect transistor forming an n-channel field effect transistor, comprising a channel region formed from a semiconductor material; a gate insulating film covering the channel region; a gate electrode covering the gate insulating film, said gate electrode being formed from a first metallic material; a source region directly contacting a side of the channel region, said source region being formed from a second metallic material; and a drain region directly contacting another side of the channel region, said drain region being formed from a third metallic material, wherein the gate electrode is formed from NiSi doped with Sb, and the source region is formed from NiSi.

According to a fifth aspect of the present invention, there is provided a field effect transistor forming a p-channel field effect transistor, comprising a channel region formed from a semiconductor material; a gate insulating film covering the channel region; a gate electrode covering the gate insulating film, said gate electrode being formed from a first metallic material; a source region directly contacting a side of the channel region, said source region being formed from a second metallic material; and a drain region directly contacting another side of the channel region, said drain region being formed from a third metallic material, wherein the gate electrode is formed from NiSi doped with Al, and the source region is formed from NiSi.

According to a sixth aspect of the present invention, there is provided a method of forming an n-channel field effect transistor, comprising: a first step of forming a gate insulating film on a silicon substrate and a poly-silicon gate electrode covering the gate insulating film; and a second step of converting portions of the silicon substrate on two sides of the gate electrode into silicide to form a source region and a drain region, and converting the gate electrode into a silicide film, wherein the first step includes a step of implanting an impurity into the gate electrode, the impurity being selected so that a work function Wg of the material forming the gate electrode and a work function Ws of the material forming the source satisfies: Wg<Ws.

According to a seventh aspect of the present invention, there is provided a method of forming a p-channel field effect transistor, comprising a first step of forming a gate insulating film on a silicon substrate and a poly-silicon gate electrode covering the gate insulating film; and a second step of converting portions of the silicon substrate on two sides of the gate electrode into silicide to form a source region and a drain region, and converting the gate electrode into a silicide film, wherein the first step includes a step of implanting an impurity into the gate electrode, the impurity being selected so that a work function Wg of the material forming the gate electrode and a work function Ws of the material forming the source satisfies: Wg>Ws.

According to the present invention, because the gate electrode, the source region, and the channel region are formed by silification, it is possible to form a field effect transistor having a gate, a source, and a drain formed from metallic materials without greatly changing the process of fabricating a semiconductor device of the related art.

These and other objects, features, and advantages of the present invention will become more apparent from the following detailed description of the preferred embodiments given with reference to the accompanying drawings.

BRIEF DESCRIPTION OF THE DRAWINGS

FIG. 1A is a schematic cross-sectional view of a MISFET, FIG. 1B is a diagram showing the energy band at the interface between the source region and the channel region of an n-channel MISFET, and FIG. 1C is a diagram showing the energy band at the interface between the source region and the channel region of a p-channel MISFET;

DESCRIPTION OF THE PREFERRED EMBODIMENTS

[Principle]

Figure 1A:
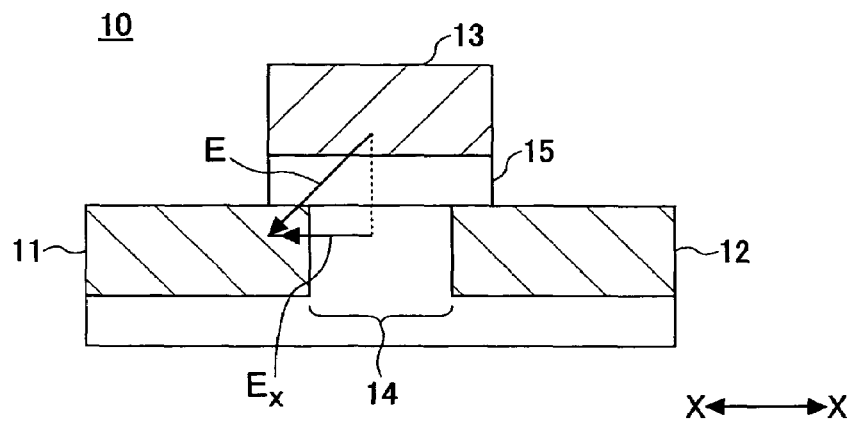
FIGS. 1A through 1C show the principle of the present invention, where.
Figure 1B:
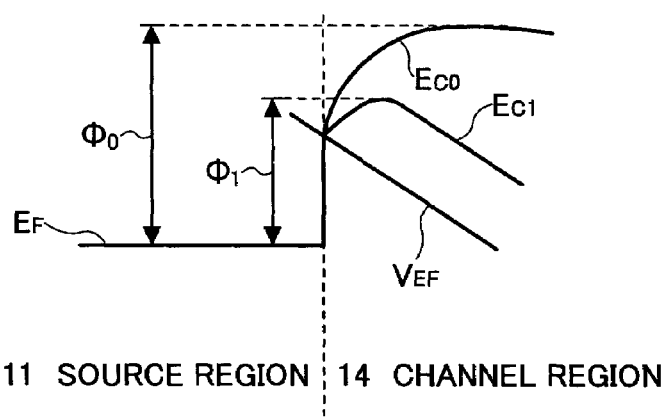
Figure 1C:
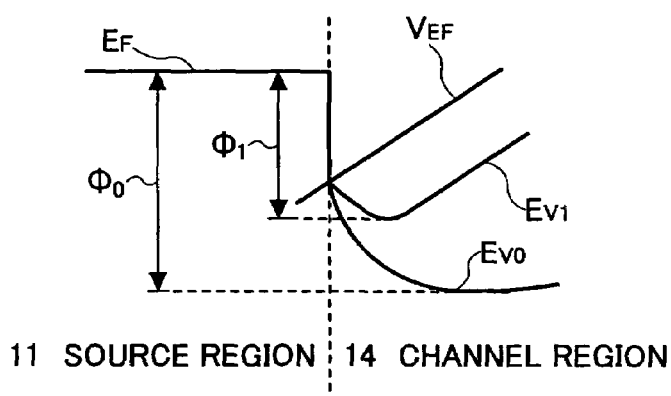

FIGS. 1A through 1C show the principle of the present invention, where, FIG. 1A is a schematic cross-sectional view of a MISFET (metal-insulating-semiconductor field effect transistor), FIG. 1B is a diagram showing the energy band at the interface between the source region and the channel region of an n-channel MISFET, and FIG. 1C is a diagram showing the energy band at the interface between the source region and the channel region of a p-channel MISFET.

As illustrated in FIG. 1A, a MISFET 10 includes a source region 11 and a drain region 12 for supplying a driving current, a gate electrode 13 acting as a control electrode, a channel region 14 formed from a silicon layer, and a gate insulating film 15. The source region 11, the drain region 12, and the gate electrode 13 are formed from metallic materials. Here, for convenience of explanation, it is assumed that the MISFET 10 is an n-channel MISFET. At the interface between the source region 11 and the channel region 14, a Shottky barrier, as shown in FIG. 1B, is formed due to metal (source region 11)—semiconductor (channel region 14) contact. As illustrated in FIG. 1B, the height of the Shottky barrier is $\Phi_0$. Generally, the Shottky barrier is sufficiently high, and results in a low probability for electrons having thermal energy corresponding to room temperature to overcome the Shottky barrier. As a result of this, the Shottky barrier prevents electrons from being injected into the channel region 14 from the source region 11, and concentration of electrons in the channel region 14 is not sufficient.

To solve this problem, for an n-channel MISFET, in the present invention, the source region 11 and the gate electrode 13 are formed from materials such that the work function Wg of the metallic material of the gate electrode 13 and the work function Ws of the metallic material of the source region 11 satisfy the relation of Wg<Ws.

With the relation of Wg<Ws being satisfied, consider the diagram of the energy band along the stacking direction of the source region 11, the gate insulating film 15, and the gate electrode 13, that is, the direction of the electric field E as shown in FIG. 1A.

From the relation of Wg<Ws, when the gate voltage is zero voltage, immediately after the source region 11, the gate insulating film 15, and the gate electrode 13 are brought into contact with each other, in other words, before thermal equilibrium is attained, electrons flow from the gate electrode 13 to the source region 11 via a connection line (not shown). Thus, electrons are stored on the surface of the source region 11 in contact with the gate insulating film 15, a positive charge exists on the surface of the gate electrode 13 in contact with the gate insulating film 15, and thermal equilibrium is attained.

Under this condition, the amount of charge Q is expressed as below, $$Q=C(Wg-Ws),$$

where C represents the capacitance between the gate electrode and the source region.

As a result of the charge Q, as illustrated in FIG. 1A, an electric field E is induced which is along the direction from the gate electrode 13 to the source region 11. The component Ex of the electric field E in the gate length direction (the X direction as illustrated in FIG. 1A) has a function of extracting electrons from the source region 11 to the channel region 14. Namely, as illustrated in FIG. 1B, in the energy band at the interface between the source region 11 and the channel region 14, as a result of a potential $V_{EF}$ associated with the electric field Ex, the bottom of the conductive band in the channel region 14 changes from $E_{C0}$ to $E_{C1}$, and the height of the Shottky barrier decreases from $\Phi_0$ to $\Phi_1$. Consequently, electrons can be easily injected into the channel region 14 from the source region 11, the concentration of electrons in the channel region 14 is improved, and the electron driving current of the n-channel MISFET 10 can be increased.

For a p-channel MISFET, the source region 11 and the gate electrode 13 are formed from metallic materials such that the work function Wg of the material of the gate electrode 13 and the work function Ws of the metallic material of the source region 11 satisfy the relation of Wg>Ws. In this case, an electric field is induced along a direction opposite to the electric field E. Hence, as illustrated in FIG. 1C, with the relation of Wg>Ws being satisfied, in the energy band at the interface between the source region 11 and the channel region 14, the top of the valence band in the channel region 14 changes from $E_{V0}$ to $E_{V1}$, and the height of the Shottky barrier against holes decreases from $\Phi_0$ to $\Phi_1$. Consequently, holes can be easily injected into the channel region 14 from the source region 11, the concentration of holes in the channel region 14 is improved, and the hole driving current of the p-channel MISFET 10 can be increased.

Below, preferred embodiments of the present inventions are described with reference to accompanying drawings.

First Embodiment

Figure 2:
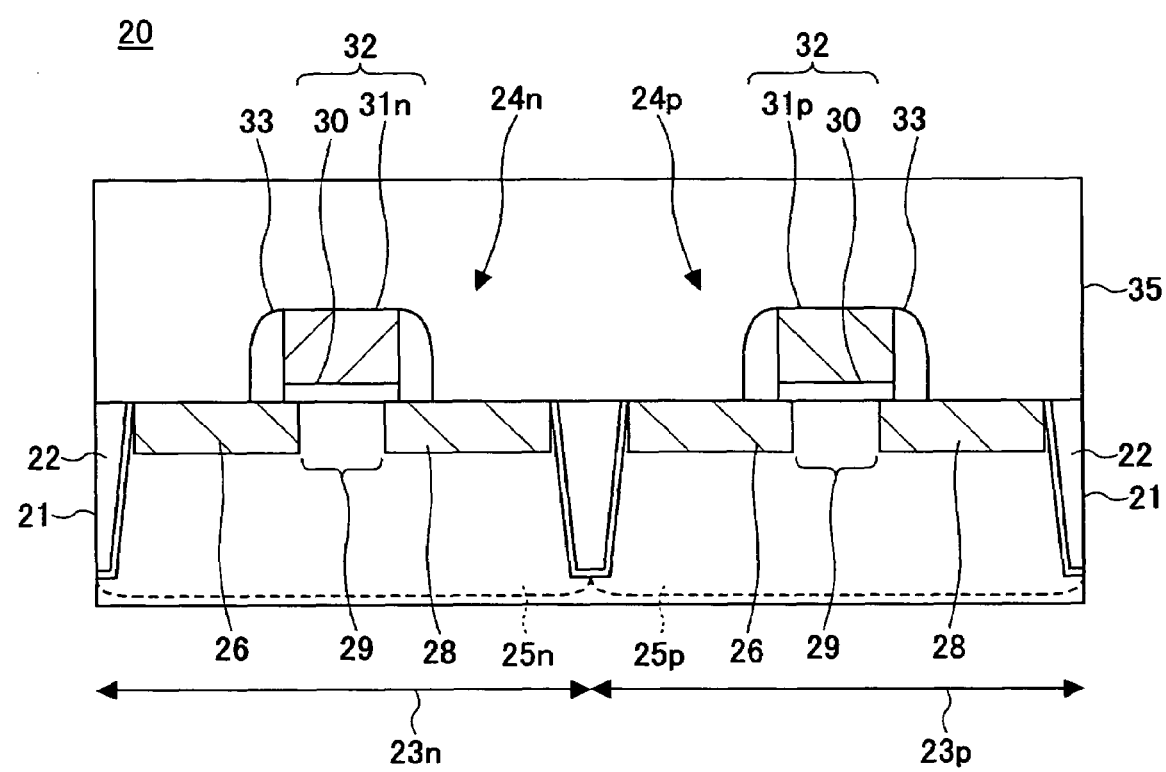
FIG. 2 is a cross-sectional view illustrating a field effect transistor according to a first embodiment of the present invention.

FIG. 2 is a cross-sectional view illustrating a field effect transistor according to a first embodiment of the present invention.

As illustrated in FIG. 2, a field effect transistor 20 includes an n-channel MISFET 24n formed in a first region 23n, a p-channel MISFET 24p formed in a second region 23p, and an interlayer insulating film 35 covering the n-channel MISFET 24n and the p-channel MISFET 24p.

The n-channel MISFET 24n and the p-channel MISFET 24p are formed on a silicon substrate 21, and are separated from each other by an element separation region 22.

The n-channel MISFET 24n in the first region 23n includes a p-well region 25n formed in the silicon substrate 21, a source region 26 and a drain region 28 formed from a metallic material, a gate insulating film 30 formed on the surface of the silicon substrate 21, a gate electrode 31n on the gate insulating film 30 and formed from a metallic material, and a sidewall insulating film 33.

Similarly, the p-channel MISFET 24p in the second region 23p includes a n-well region 25p formed in the silicon substrate 21, a source region 26 and a drain region 28 formed from a metallic material, a gate insulating film 30 formed on the surface of the silicon substrate 21, a gate electrode 31p on the gate insulating film 30 and formed from a metallic material, and a sidewall insulating film 33.

The p-well region 25n in the first region 23n, and the n-well region 25p in the second region 23p are formed by introducing impurities into the silicon substrate 21 by well known thermal diffusion or ion implantation. For the p-well region 25n, the impurities may be trivalent elements such as Boron or In, and for the n-well region 25p, the impurities may be pentavalent elements such as P or As. Preferably, concentrations of the impurities in the p-well region 25n and the n-well region 25p are below $10^{17}$ cm$^{-3}$. If the impurity concentration is above $10^{17}$ cm$^{-3}$, mobility of electrons or holes decreases remarkably due to scattering with the impurities.

If a p-type silicon substrate or an n-type silicon substrate is used, formation of the p-well region 25n or the n-well region 25p may be omitted. Further, by using an intrinsic silicon substrate, it is not necessary to form the p-well region 25n or the n-well region 25p. In this case, it is possible to prevent decrease of mobility of electrons caused by scattering with the impurities.

The gate insulating film 30 may be formed from a silicon oxide film, or high-k films of silicon nitride, silicon nitride oxide, $Al_2O_3$, $Ta_2O_3$, $HfO_2$, $ZrO_2$, or HfSiON, or a stacked structure of the above films. It is preferable to use the above high-k films because the high-k films have the advantages of increasing the capacitance of a MIS capacitor, and further decreasing the barrier height between the source region 26 and a channel region 29 by stored charge.

The source region 26 and the drain region 28 are formed from metallic materials, for example, single metals, alloys, or conductive intermetallic compounds. The single metals may include Ti (3.57 eV), Pb (4.00 eV), Mn (4.08 eV), Ta (4.16 eV), Mo (4.41 eV), Ag (4.44 eV), Cr (4.44 eV), W (4.55 eV), Fe (4.60 eV), Co (4.97 eV), Cu (5.02 eV), or Pt (5.63 eV). Here, the figures in brackets are values of work functions of the corresponding metals.

The aforesaid alloys may be alloys of these single metals and may also be used. The aforesaid conductive intermetallic compounds may be silicides of metal elements, germanates (germanium compounds), germano-silicides (germanium silicon compounds), and metallic nitrides. Metallic elements in the silicides, germanates, and germano-silicides may be Ni, Co, Ta, or Ti. The metallic nitrides may be TiN, HfN, TaN, or ZrN.

The gate electrode 31n and gate electrode 31p are also formed from metallic materials, and the same as the source region 26 and the drain region 28, the aforesaid single metals, alloys, or conductive intermetallic compounds can be used.

In the n-channel MISFET 24n, it is set that the work function Wg of the metallic material of the gate electrode 31n and the work function Ws of the metallic material of the source region 26 satisfy the relation of Wg<Ws.

As described above in the principle of the present invention, because of the difference between the work function Wg of the metallic material of the gate electrode 31n and the work function Ws of the metallic material of the source region 26 (Wg–Ws), an electric field E is induced along the direction from the gate electrode 31n to the source region 26, and the electric field E has a function of extracting electrons from the source region 26 to the channel region 29, and the height of the Shottky barrier against electrons at the interface between the source region 26 and the channel region 29 is lowered. Consequently, electrons can be easily injected into the channel region 29 from the source region 26, the concentration of electrons in the channel region 29 is improved, and the electron driving current of the n-channel MISFET 24n is increased. Similarly, the height of the Shottky barrier at the interface between the drain region 28 and the channel region 29 is also lowered.

Further, with a silicide, it is possible to control the work function by introducing impurities into a silicon film in advance. For example, it is reported by Cabral et al. in "2004 Symposium on VLSI Technology" pp. 184-185, that when a silicide is formed by implanting a Sb or Al impurity into a poly-silicon film, a change of the work function is observed compared to the case without impurity implantation.

In combinations of the gate electrode 31n and the source region 26, which satisfy the relation of Wg<Ws, it is preferable that the gate electrode 31n be formed from NiSi doped with Sb, which has a work function of Wg=4.27 eV, and the source region 26 be formed from NiSi, which has a work function of Ws=4.65 eV. These gate electrode 31n and source region 26 can be formed easily by a silicide process.

In the p-channel MISFET 24p, it is set that the work function Wg of the metallic material of the gate electrode 31p and the work function Ws of the metallic material of the source region 26 satisfies the relation of Wg<Ws.

As described above in the principle of the present invention, because of the difference between the work function Wg the gate electrode 31p and the work function Ws of the source region 26 (Wg–Ws), an electric field E is induced along the direction from the gate electrode 31p to the source region 26, the electric field E has a function of extracting holes from the source region 26 to the channel region 29, and the height of the Shottky barrier against holes at the interface between the source region 26 and the channel region 29 is lowered. Consequently, holes can be easily injected into the channel region 29 from the source region 26, the concentration of holes in the channel region 29 is improved, and the hole driving current of the p-channel MISFET 24p is increased. Similarly, the height of the Shottky barrier at the interface between the drain region 28 and the channel region 29 is also lowered.

In the p-channel MISFET 24p, the gate electrode 31p, the source region 26, and the drain region 28 can be formed from the same materials as those in the n-channel MISFET 24n as described above.

In combinations of the gate electrode 31p and the source region 26, which satisfy the relation of Wg>Ws, it is preferable that the gate electrode 31p be formed from NiSi doped with Al, which has a work function of Wg=4.79 eV, and the source region 26 be formed from NiSi, which has a work function of Ws=4.65 eV. Alternatively, it is preferable that the gate electrode 31p be formed from Ni(Pt)Si doped with Al, which has a work function of Wg=4.96 eV, and the source region 26 be formed from Ni(Pt)Si, which has a work function of Ws=4.76 eV.

These gate electrode 31p and source region 26 can be formed easily by a silicide process.

Preferably, the source region 26 and the drain region 28 overlap with the gate electrode 31n or 31p, because this increases the electric field between the gate electrode 31n or 31p and the source region 26 or the drain region 28, and further lowers the barrier height.

According to the present invention, it is possible to lower the barrier height at the interface between the source region 26 and the channel region 29, increase concentrations of electrons or holes injected into the channel region 29, and thereby, it is possible to increase the driving current of the field effect transistor of the present embodiment.

Next, descriptions are made of a method of fabricating the field effect transistor of the present embodiment with reference to FIGS. 3A through 3C and FIGS. 4A through 4C.

Figure 3A:
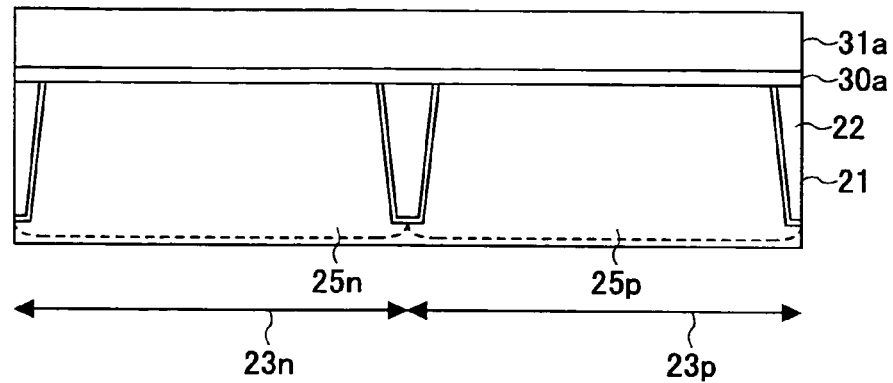
FIGS. 3A through 3C are cross-sectional views illustrating a method of fabricating a field effect transistor according to the first embodiment of the present invention.
Figure 3B:
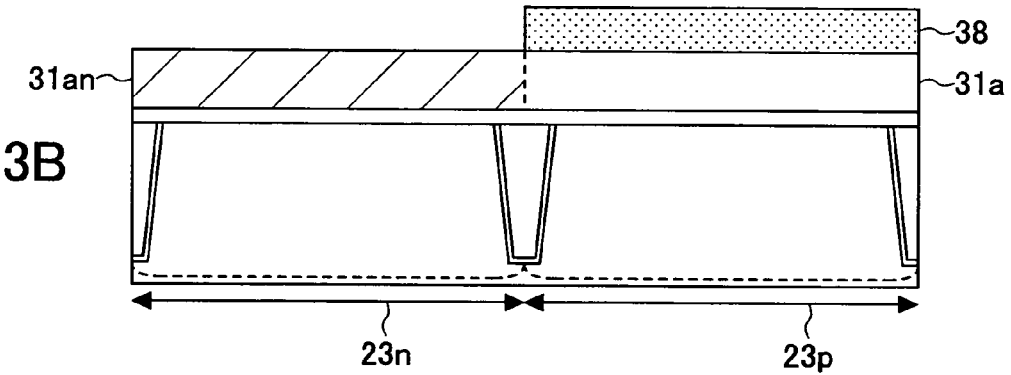
Figure 3C:
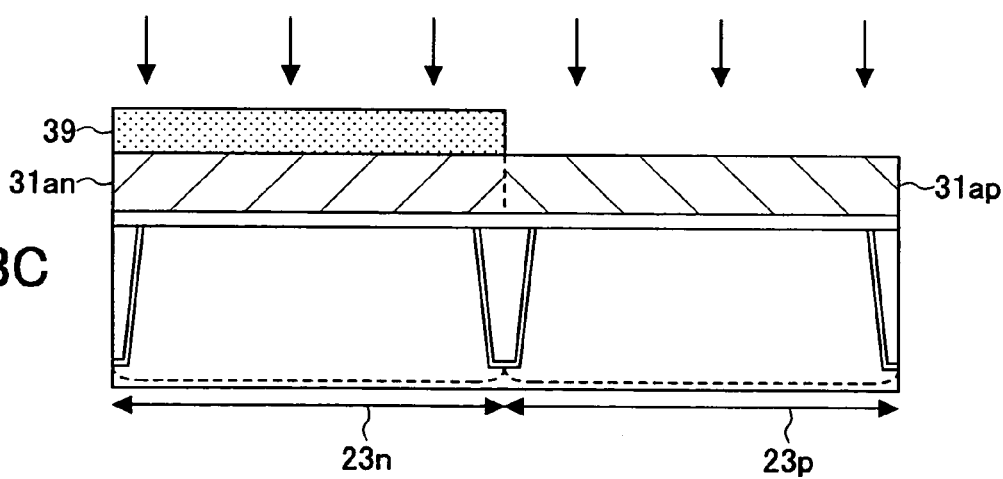

FIGS. 3A through 3C are cross-sectional views illustrating a method of fabricating a field effect transistor according to the first embodiment of the present invention.

Continuing from FIG. 3C, FIGS. 4A through 4C are cross-sectional views illustrating the method of fabricating the field effect transistor according to the first embodiment of the present invention.

In the step illustrated in FIG. 3A, element separation regions 22 are formed in the silicon substrate 21 by means of STI (shallow trench isolation). P-type impurities are implanted into the first region 23n, where the n-channel MISFET 24n is to be formed, to form a p-well, and n-type impurities are implanted into the second region 23p, where the p-channel MISFET 24p is to be formed, to form an n-well.

Further, a gate insulating film 30a and a poly-silicon film 31a are deposited on the silicon substrate 21 by CVD or sputtering. For example, the gate insulating film 30a and the poly-silicon film 31a may be a silicon oxide film or a high-k film.

In the step illustrated in FIG. 3B, a resist film 38 is formed on the poly-silicon film 31a, and then an opening is formed in the resist film 38 to form the first region 23n by photolithography.

Then, Sb is implanted into the poly-silicon film 31a in the first region 23n by ion implantation, for example, with the impurity concentration of Sb being about $10^{20}$ cm$^{-3}$.

Here, the impurities implanted into the poly-silicon film 31a are selected so that the work function Wg after the poly-silicon film 31a is converted into silicide is less than the work function Ws of the metallic material forming the source region 26 in the first region 23n.

In the step illustrated in FIG. 3C, the resist film 38 shown in FIG. 3B is removed. After that, a resist film 39 is deposited on the poly-silicon film 31a, then an opening is formed in the resist film 39 to form the second region 23p by photolithography.

Then, Al is implanted into the poly-silicon film 31a in the second region 23p by ion implantation, for example, with the impurity concentration of Al being about $10^{20}$ cm$^{-3}$.

Here, the impurities implanted into the poly-silicon film 31a are selected so that the work function Wg after the poly-silicon film 31a is converted into silicide is less than the work function Ws of the metallic material forming the source region 26 in the second region 23p.

Figure 4A:
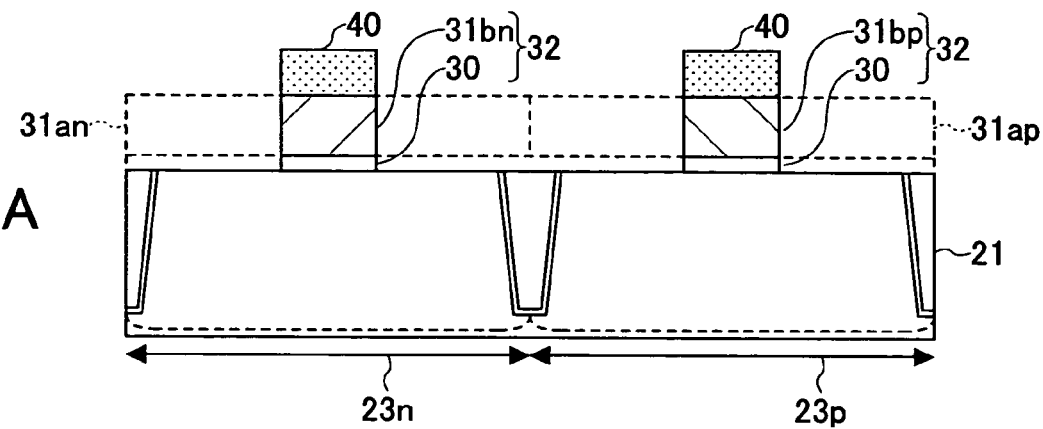
FIGS. 4A through 4C, continuing from FIG. 3C, are cross-sectional views illustrating the method of fabricating the field effect transistor according to the first embodiment of the present invention.

In the step illustrated in FIG. 4A, the resist film 39 shown in FIG. 3C is removed. After that, a resist film 40 is deposited on the poly-silicon film, then, the resist film 40 is patterned by photolithography to form a gate electrode pattern.

In addition, with the resist film 40 as a mask, the poly-silicon film and the gate insulating film 30 are etched sequentially by RIE, thereby forming a stacked structure including the gate insulating film 30 and the gate electrode.

Figure 4B:
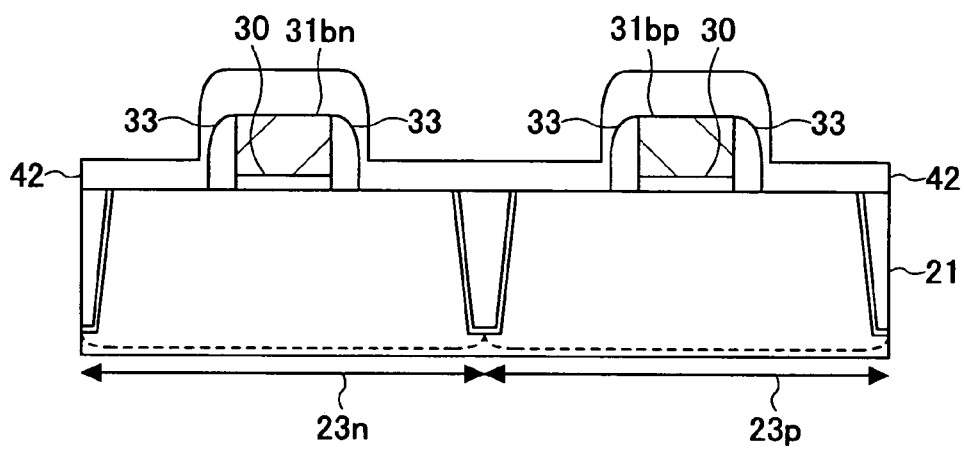

In the step illustrated in FIG. 4B, a metal film, for example, a Ni film 42 is deposited by CVD or sputtering to cover the silicon substrate 21, a sidewall insulating film 33, and the gate electrode. The Ni film 42 is set to have such a thickness that the poly-silicon film of the gate electrode reaches the surface of the gate insulating film 30, for example, the thickness of the Ni film 42 is 100 nm.

Figure 4C:
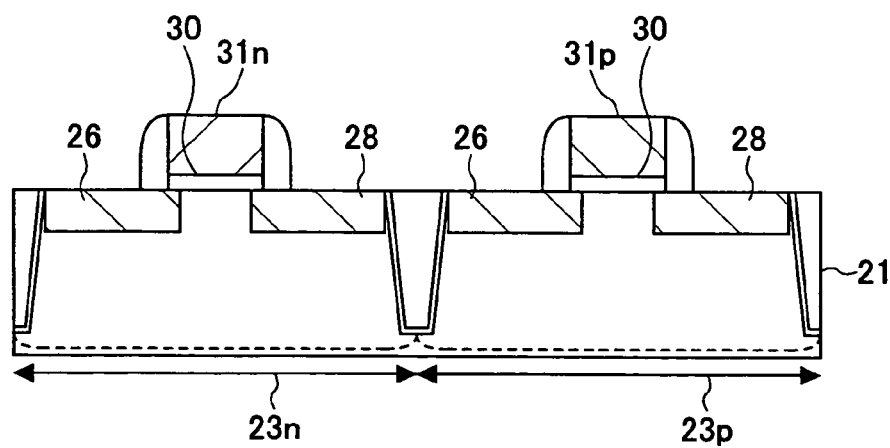

In the step illustrated in FIG. 4C, a thermal process is performed at a temperature of 400° C. to 500° C. by using a RTP (Rapid Thermal Process) device to induce reactions between the Ni film and the silicon substrate 21 and the poly-silicon of the gate electrode, thereby, forming the source region 26 and the drain region 28 from NiSi in the silicon substrate 21 on two sides of the gate electrode, and silicifying the gate electrode up to the interface with the gate insulating film 30.

Further, wet etching is executed on the un-reacted Ni film 42 by using a mixed solution of ammonia and hydrogen peroxide (this is referred to as "the first process"). Then, wet etching is executed by using a mixed solution of ammonia, sulfuric acid and hydrogen peroxide (this is referred to as "the second process") to remove the un-reacted Ni film.

Next, a thermal process is performed at a temperature of 400° C. to 500° C. by using a RTP (Rapid Thermal Process) device. It is preferable to form a NiSi film because the temperature of the thermal process for forming the NiSi film is low (400° C. to 500° C.).

In addition to the NiSi film, a $CoSi_2$ film, a $TaSi_2$ film, a $TiSi_2$ film, or a PtSi film may also be formed. For example, the temperature of the thermal process for forming the $CoSi_2$ film may be set to be 500° C. to 700° C.

By silification of the silicon substrate 21, the thus formed source region 26 and drain region 28 extend through the region below the side wall insulating film 33 to the region near the end of the gate insulating film 30 which is on the inner side.

As described above in the principle of the present invention, because of the difference between the work function Wg of the gate electrode and the work function Ws of the metallic material of the source region, the electric field E is strengthened, and the height of the Shottky barrier at the interface between the source region 26 and the channel region 29 is lowered.

The gate electrode 31n in the first region 23n is silicified, and thereby, the gate electrode is converted into a NiSi film doped with Sb. Such a NiSi film doped with Sb, which forms the gate electrode 31n, has a work function of Wg=4.27 eV, and is lower than the work function of Ws=4.65 eV of NiSi, which forms the source region 26.

While, the gate electrode 31p in the second region 23p is silicified, and thereby, the gate electrode 31p is converted into a NiSi film doped with Al. Such a NiSi film doped with Al, which forms the gate electrode 31p, has a work function of Wg=4.79 eV, and is lower than the work function of Ws=4.65 eV of NiSi, which forms the source region 26.

After the step in FIG. 4C, an interlayer insulating film 35 is formed to cover the structure shown in FIG. 4C, then, the surface of interlayer insulating film 35 is polished by CMP, thereby obtaining the semiconductor device illustrated in FIG. 2.

According to the method of forming a field effect transistor of the present embodiment, by implanting impurities into the gate electrode, it is easy to form a silicide layer having a different work function from that of the source region 26.

In addition, because the gate electrode 31n, 31p, the source region 26, and the drain region 28 are formed by a silification process, the gate electrode 31n, 31p, the source region 26, and the drain region 28 can be formed from metallic materials without greatly changing the process of fabricating a semiconductor device of the related art.

It should be noted that although it is described above that the gate electrode 31n, 31p, the source region 26, and the drain region 28 are formed from silicides, the gate electrode 31n, 31p, the source region 26, and the drain region 28 may also be formed from other metallic materials as mentioned above.

Figure 5:
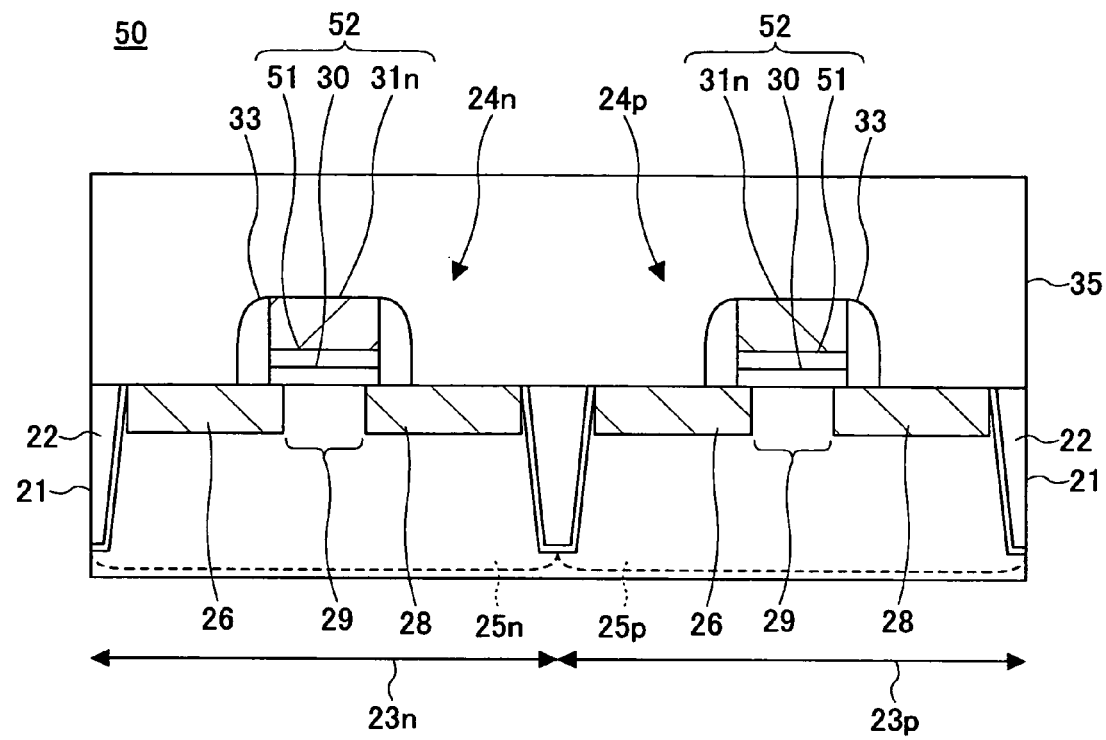
FIG. 5 is a cross-sectional view illustrating another example of the field effect transistor according to the first embodiment of the present invention.

FIG. 5 is a cross-sectional view illustrating another example of the field effect transistor according to the first embodiment of the present invention.

In FIG. 5, the same reference numbers are assigned to the same elements as those described previously, and overlapping descriptions are omitted.

As illustrated in FIG. 5, in the field effect transistor 50, gate insulating films 30, barrier films 51, and a gate electrode 31n or 31p are stacked in order, forming gate stacked structures 52.

The field effect transistor 50 is the same as the field effect transistor 20 in FIG. 2 except that barrier films 51 are provided.

For example, the barrier film 51 may be formed from $Al_2O_3$. The barrier film 51 acts as a gate insulating film, and also has a function of preventing metallic elements in the metallic materials constituting the gate electrode 31n and 31p from diffusing into the gate insulating film 30.

If metallic elements diffuse into the gate insulating film 30, fixed charge or trapping charge occurs, and this reduces mobility of carriers.

Second Embodiment

Figure 6:
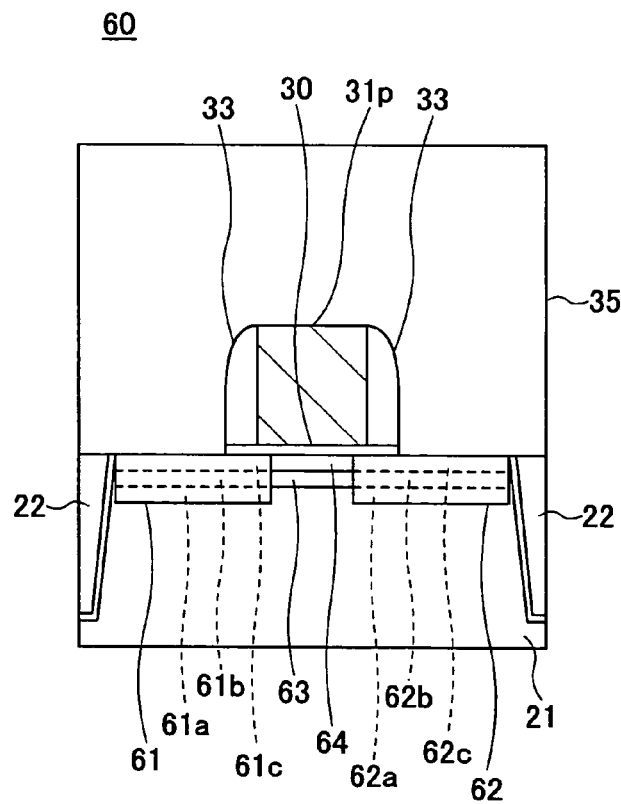
FIG. 6 is a cross-sectional view illustrating a field effect transistor according to a second embodiment of the present invention.

FIG. 6 is a cross-sectional view illustrating a field effect transistor according to a second embodiment of the present invention.

In this embodiment, the same reference numbers are assigned to the same elements as those described previously, and overlapping descriptions are omitted.

Here, for convenience of explanation, it is assumed that the field effect transistor of the present embodiment is a p-channel MISFET. For an n-channel MISFET, the description is basically the same as that of a p-channel MISFET except that the work functions Wg and Ws of the metallic materials forming the gate electrode and the source region satisfy the relation of Wg<Ws.

As illustrated in FIG. 6, a field effect transistor 60 includes a source region 61 and a drain region 62 formed from a metallic material, a SiGe layer 63 formed on the silicon substrate 21 and acting as a channel layer, a silicon cap layer 64 covering the SiGe layer 63, a gate insulating film 30 formed on the surface of the silicon cap layer 64, a gate electrode 31p on the gate insulating film 30 and formed from a metallic material, a sidewall insulating film 33, and an interlayer insulating film 35.

For example, the SiGe layer 63 is 10 nm in thickness, and is formed on the silicon substrate 21 by epitaxial growth. In the SiGe layer 63, because the lattice constant of SiGe is greater than that of silicon, compression strain of the SiGe layer 63 is induced.

The composition of the SiGe layer 63 can be expressed by a formula $Si_{1-x}Ge_x$, where, x indicates a composition ratio of Ge, and satisfies 0<x<1. Preferably, x indicates 0<x<0.3. If x is greater than 0.3, the difference of the lattice constant with the silicon substrate increases too much, dislocation may occur, and this may reduce compression strain of the SiGe layer 63 and degrade crystalline properties of the SiGe layer 63.

In the compression-strained SiGe layer 63, the band gap becomes narrow, and this lowers the height of the Shottky barrier at the interface between the source region 61 and the SiGe layer 63.

Namely, because of the Shottky effect as a result of the difference of work functions of the metallic materials between the gate electrode 31p and the source region 61, and the strained SiGe layer 63, the height of the Shottky barrier at the interface between the source region 61 and the channel region 63 is further reduced, and carriers can be injected at high concentrations. In addition, in the SiGe layer 63, because of the compression strain of the SiGe layer 63, mobility of holes is improved.

In addition, if p-type impurities are introduced into the SiGe layer 63, preferably, concentrations of the impurities are below $10^{17}$ cm$^{-3}$. But it should be noted that implantation of impurities into the SiGe layer 63 is not required.

The silicon cap layer 64, for example, is 10 nm thick, and it formed to cover the SiGe layer 63. The silicon cap layer 64 is less strained. The silicon cap layer 64 functions to prevent diffusion of Ge atoms from the SiGe layer 63, and prevent formation of interface levels of Ge at the interface between the gate insulating film 30 and the silicon cap layer 64. It is desirable that the silicon cap layer 64 be thin, for example, the thickness of the silicon cap layer 64 may be set to be 1 nm to 10 nm.

In the silicon cap layer 64, p-type impurities may be introduced; in this case, it is preferable that concentrations of the impurities be below $10^{17}$ cm$^{-3}$. But it should be noted that implantation of impurities into the SiGe layer 63 is not required.

The source region 61 and the drain region 62 may be formed from the metallic materials as described in the first embodiment. Here, for example, the source region 61, or the drain region 62, includes a stacked structure of the silicon substrate 21, the SiGe layer 63, and a silicon-metal silicide film or a germano-silicide film. Specifically, the source region 61 includes a silicide film 61a, a germano-silicide film 61b, and a silicide film 61c, which are arranged in order from the bottom. Similarly, the drain region 62 includes a silicide film 62a, a germano-silicide film 62b, and a silicide film 62c, which are arranged in order from the bottom.

The same as the first embodiment, it is set that the work function Wg of the material forming the gate electrode 31p, and the work functions Ws of the silicide film 61a and germano-silicide film 61b of the source region 61 satisfy the relation of Wg<Ws.

According to the present embodiment, in addition to effects obtained by the first embodiment, because the channel layer is formed from the compression-strained SiGe layer 63, the barrier height at the interface between the source region 61 and the channel region 63 is further lowered, and concentration of carriers in the channel layer is further increased, and hence, the driving current is increased.

Third Embodiment

Figure 7:
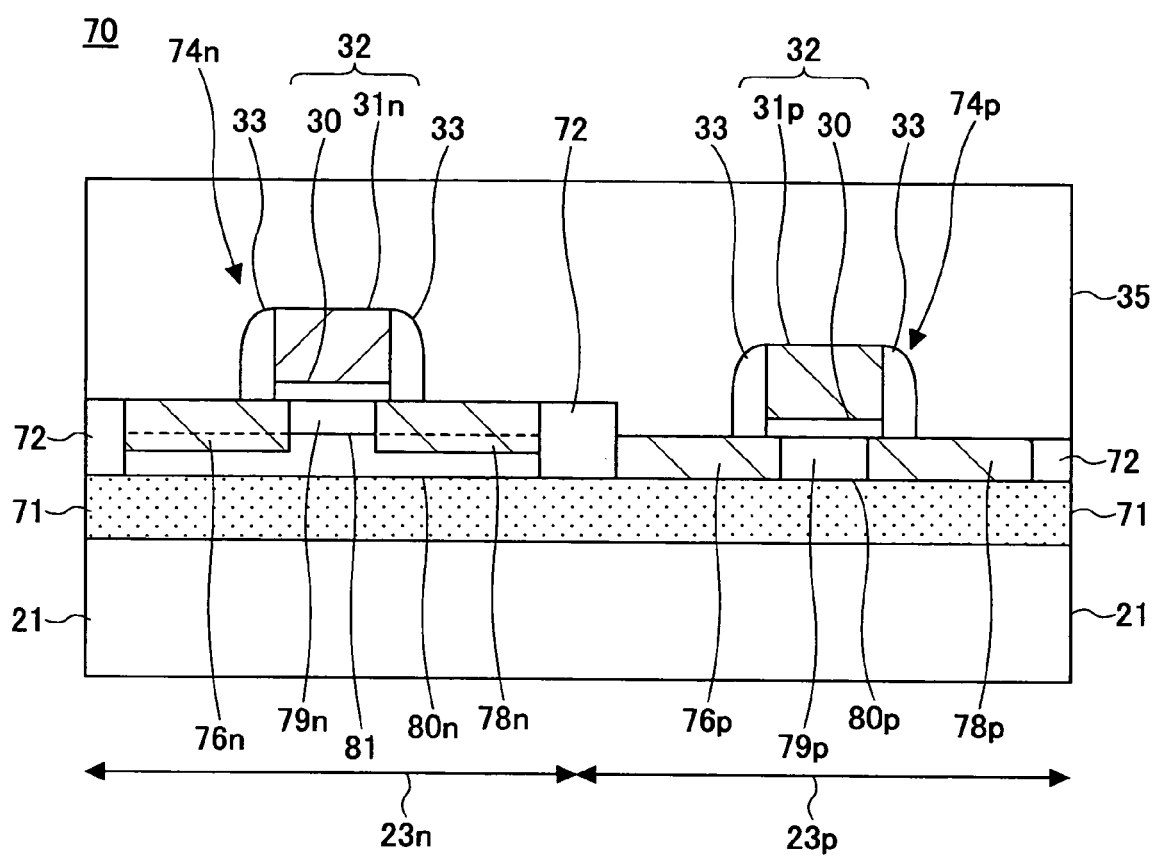
FIG. 7 is a cross-sectional view illustrating a field effect transistor according to a third embodiment of the present invention.

FIG. 7 is a cross-sectional view illustrating a field effect transistor according to a third embodiment of the present invention.

In this embodiment, the same reference numbers are assigned to the same elements as those described previously, and overlapping descriptions are omitted.

As illustrated in FIG. 7, a field effect transistor 70 includes a silicon substrate 21, an oxide film 71 embedded in the silicon substrate 21, a first region 23n and a second region 23p separated from each other by an element separation region 72.

In the first region 23n, an n-channel MISFET 74n is provided on a stacked structure on the embedded oxide film 71, which includes a SiGe film 80n and a tensile-strained silicon film 81 arranged in order. In the second region 23p, a p-channel MISFET 74p is provided on a compression-strianed SiGe film 80p on the embedded oxide film 71.

Namely, the field effect transistor 70 is a complementary FET.

The n-channel MISFET 74n in the first region 23n includes a source region 76n and a drain region 78n formed from a metallic material on the embedded oxide film 71, a gate insulating film 30 formed on the surface of the strained silicon film 81 sandwiched by the source region 76n and the drain region 78n, a gate electrode 31n on the gate insulating film 30 and formed from a metallic material, and a sidewall insulating film 33. A channel region 79n is formed in the strained silicon film 81.

The strained silicon film 81 is formed by epitaxial growth on the underlying less-strained SiGe film 80n. Because the lattice of the SiGe film 80n is less strained, its lattice constant is greater than that of the silicon film 81 that is not strained. For this reason, tensile strain of the silicon film 81, which is epitaxially grown on the SiGe film 80n, may be induced inside the plane of the film due to a difference of the lattice constants. As a result, mobility of electrons in the strained silicon film 81 is improved.

Preferably, the direction of the tensile strain is substantially parallel to the gate length direction, that is, the direction connecting the source region 76n and the drain region 78n.

For example, the less-strained SiGe film 80n may be formed as below.

By molecule epitaxial or CVD (for example, ultra-high vacuum CVD, hydrogen reduction method, thermal decomposition method, MOCVD, or others), compression-strained SiGe films, that is, the compression-strained SiGe film 80n in the first region 23n and the compression-strained SiGe film 80p in the second region 23p, are formed by epitaxial growth on the silicon substrate 21, for example, having thickness of 40 nm.

Next, after the embedded oxide film 71 is formed in the silicon substrate 21 near the interface with the compression-strained SiGe films, strain of the compression-strained SiGe film 80n in the first region 23n is reduced by selective thermal treatment. Meanwhile, the compression-strained SiGe film 80p in the second region 23p is not subjected to the selective thermal treatment, hence, the strain of the compression-strained SiGe film 80p is maintained.

The thickness of the SiGe layer 80n is set in the range from 5 to 60 nm, and preferably, in the range from 10 to 40 nm. The composition of the SiGe layer 80n can be expressed by a formula $Si_{1-x}Ge_x$, where x indicates the composition ratio of Ge, and satisfies the relation of 0<x<1. Preferably, x satisfies the relation of 0.1<x<0.4.

If the composition ratio of Ge is lower than 0.1, the tensile stress applied in the silicon film is not sufficient, and if the composition ratio of Ge is higher than 0.4, dislocation may occur at the interface with the strained silicon film 81, and this may make the tensile stress applied in the silicon film 81 not uniform.

The same is true for the thickness, composition and others of the compression-strained SiGe film 80p in the second region 23p.

The source region 76n and the drain region 78n in the first region 23n are formed on portions of the strained silicon film 81 and the SiGe layer 80n. For example, the source region 76n or the drain region 78n includes a silicide film and a germano-silicide film.

The gate electrode 31n is formed from a silicide film, which is obtained by silicifying a poly-silicon film implanted with impurities.

The source region 76n and the drain region 78n in the first region 23n may also be formed on the strained silicon film 81.

Besides the silicide film, the gate electrode 31n, the source region 76n, and the drain region 78n may also be formed from other metallic materials as described in the first embodiment, such as single metals, alloys, or conductive intermetallic compounds. In this case, the source region 76n and the drain region 78n may also be formed by providing grooves on the strained silicon film 81 and filling the grooves with metallic materials.

In the n-channel MISFET 74n, the same as the first embodiment, it is set that the work function Wg of the metallic material of the gate electrode 31n and the work function Ws of the metallic material of the source region 76n satisfy the relation of Wg<Ws. Because of the difference of the work functions between the gate electrode 31n and the source region 76n, the height of the Shottky barrier against electrons at the interface between the source region 76n and the channel region 79n is lowered, and the concentration of electrons in the channel region 79n is improved.

The p-channel MISFET 74p in the second region 23p includes a source region 76p and a drain region 78p formed from a metallic material on the embedded oxide film 71, a gate insulating film 30 formed on the surface of the strained SiGe film 80p sandwiched by the source region 76p and the drain region 78p, a gate electrode 31p on the gate insulating film 30 and formed from a metallic material, and a sidewall insulating film 33. A channel region 79p is formed in the compression-strained SiGe film 80p.

Compression strain of the strained SiGe film 80p is induced inside the plane of the film.

For example, when the strained SiGe film 80p is deposited by epitaxial growth by means of CVD on the Si substrate 21, because the lattice constant of the not strained SiGe film is greater than that of the silicon film, compression strain of the strained SiGe film 80p is induced due to a difference of the lattice constants. As a result, the band gap becomes narrow in the strained SiGe layer 80n, and this lowers the barrier height against holes at the interface between the source region 76p and the channel layer 78p.

Preferably, the direction of the compression strain is substantially parallel to the gate length direction, that is, the direction connecting the source region 76p and the drain region 78p.

The source region 76p and the drain region 78p in the second region 23p are formed on the strained SiGe layer 80p. For example, the source region 76n or the drain region 78n includes a germano-silicide film.

The gate electrode 31p is formed from a silicide film, which is obtained by silicifying a poly-silicon film implanted with impurities.

Besides the silicide film, the gate electrode 31p, the source region 76p, and the drain region 78p may also be formed from other metallic materials as described in the first embodiment, such as single metals, alloys, or conductive intermetallic compounds. In this case, the source region 76p and the drain region 78p may also be formed by providing grooves on the strained SiGe film 80p and filling the grooves with metallic materials.

In the p-channel MISFET 74p, the same as the first and second embodiments, it is set that the work function Wg of the metallic material of the gate electrode 31p and the work function Ws of the metallic material of the source region 76p satisfy the relation of Wg>Ws. Because of the difference of the work functions between the gate electrode 31p and the source region 76p, the height of the Shottky barrier against holes at the interface between the source region 76p and the channel region 79p is lowered, and the concentration of holes in the channel region 79p is improved.

In the field effect transistor 70 according to the present embodiment, because the channel region 79n and the channel region 79p are formed in the strained Si thin film 81 or the strained SiGe thin film 80p, which are formed on the embedded oxide film 71, it is possible to reduce the stray capacitance and suppress the short channel effect.

According to the present embodiment, it is possible to lower the barrier height at the interface between the source regions 76n, 76p and the channel regions 79n, 79p, as in the first embodiment, and because the channel regions 79n, 79p are formed from the tensile-strained silicon film 81 (n-channel MISFET 74n) or the compression-strained SiGe film 80p (p-channel MISFET 74p), mobility of electrons or holes is increased, enabling high speed operation.

It is clear that either a single n-channel MISFET 74n, or a single p-channel MISFET 74p may also be used as the field effect transistor 70 of the present embodiment, and the same effect can be obtained.

Further, in addition to the aforementioned SIMOX method, the silicon substrate 21 and the embedded oxide film 71 may also be formed by bonding, or any other well-known methods of forming a SOI substrate. The silicon substrate may also be replaced by a sapphire ($Al_2O_3$) substrate, a SiC substrate, or the like.

While the invention is described above with reference to specific embodiments chosen for purpose of illustration, it should be apparent that the invention is not limited to these embodiments, but numerous modifications could be made thereto by those skilled in the art without departing from the basic concept and scope of the invention.

According to the present invention, it is possible to lower the barrier height at the interface between the source region and the channel region, and increase the concentration of carriers in the channel region, and this improves the driving current of the field effect transistor.

What is claimed is:

1. A field effect transistor forming an n-channel field effect transistor, comprising:
   a channel region made of a semiconductor material and formed in a semiconductor substrate;
   a gate insulating film formed over the channel region;
   a gate electrode formed over the gate insulating film;
   a source region arranged at a side of the channel region; and
   a drain region arranged at another side of the channel region,
   wherein a work function Wg of a material of said gate electrode and a work function Ws of a material of said source region satisfy Wg<Ws, and
   wherein each of said gate electrode, said source region, and said drain region is made of one of a metal, an alloy, and a conductive intermetallic compound.

2. A field effect transistor forming a p-channel field effect transistor, comprising:

a channel region made of a semiconductor material and formed in a semiconductor substrate;
a gate insulating film formed over the channel region;
a gate electrode formed over the gate insulating film;
a source region arranged at a side of the channel region; and
a drain region arranged at another side of the channel region,
wherein a work function Wg of a material of said gate electrode and a work function Ws of a material of said source region satisfy Wg>Ws, and
wherein each of said gate electrode, said source region, and said drain region is made of one of a metal, an alloy, and a conductive intermetallic compound.

3. A field effect transistor forming a complementary field effect transistor, comprising:
an n-channel field effect transistor; and
a p-channel field effect transistor,
wherein the n-channel field effect transistor includes a channel region made of a semiconductor material and formed in a semiconductor substrate;
a gate insulating film covering the channel region;
a gate electrode covering the gate insulating film;
a source region directly contacting a side of the channel region; and
a drain region directly contacting another side of the channel region,
wherein a work function Wg of said gate electrode and a work function Ws of said source region of the n-channel field effect transistor satisfy Wg<Ws, and the p-channel field effect transistor includes a channel region made of a semiconductor material;
a gate insulating film covering the channel region;
a gate electrode covering the gate insulating film;
a source region directly contacting a side of the channel region; and
a drain region directly contacting another side of the channel region,
wherein a work function Wg of said gate electrode and a work function Ws of said source region of the p-channel field effect transistor satisfy Wg>Ws, and
wherein each of said gate electrode, said source region, and said drain region is one of a metal, an alloy, and a conductive intermetallic compound.

4. The field effect transistor as claimed in claim 1, wherein the conductive intermetallic compound includes one of a metallic silicide, a germanium compound, and a germano-silicide.

5. A field effect transistor forming an n-channel field effect transistor, comprising:
a channel region made of a semiconductor material and formed in a semiconductor substrate;
a gate insulating film covering the channel region;
a gate electrode covering the gate insulating film, said gate electrode being made of NiSi doped with Sb;
a source region directly contacting a side of the channel region, said source region being made of NiSi; and
a drain region directly contacting another side of the channel region, said drain region being made of a metallic material,
wherein said metallic material is one of a metal, an alloy and a conductive intermetallic compound.

6. A field effect transistor forming a p-channel field effect transistor, comprising:
a channel region made of a semiconductor material and formed in a semiconductor substrate;
a gate insulating film covering the channel region;
a gate electrode covering the gate insulating film, said gate electrode being made of NiSi doped with Al;
a source region directly contacting a side of the channel region, said source region being made of NiSi; and
a drain region directly contacting another side of the channel region, said drain region being made of a metallic material,
wherein said metallic material is one of a metal, an alloy and a conductive intermetallic compound.

7. The field effect transistor as claimed in claim 1, wherein the gate electrode directly contacts the gate insulating film.

8. The field effect transistor as claimed in claim 1, wherein the gate insulating film is one of a silicon nitride film, a silicon nitride oxide film, a $Al_2O_3$ film, a $Ta_2O_3$ film, a $HfO_2$ film, and a $ZrO_2$ film.

9. The field effect transistor as claimed in claim 1, wherein the channel region is a silicon layer or a silicon substrate.

10. The field effect transistor as claimed in claim 9, wherein the channel region is an intrinsic silicon layer or an intrinsic silicon substrate.

11. The field effect transistor as claimed in claim 1, wherein the channel region is a $Si_{1-x}Ge_x$ layer with compression strain being induced therein, where x indicates a composition ratio of Ge, and satisfies 0<x<1.

12. The field effect transistor as claimed in claim 11, wherein the $Si_{1-x}Ge_x$ layer is formed by epitaxial growth on a silicon substrate.

13. The field effect transistor as claimed in claim 11, wherein a relaxed silicon layer is on the $Si_{1-x}Ge_x$ layer.

14. The field effect transistor as claimed in claim 1, wherein the channel region is a silicon layer or a $Si_{1-x}Ge_x$ layer on an insulating substrate, where, x indicates a composition ratio of Ge, and satisfies 0<x<1, and the source region and the drain region are on the insulating substrate.

15. The field effect transistor as claimed in claim 14, wherein the source region and the drain region are respectively made of one of a silicide, a germanium compound, and a germano-silicide provided on the silicon layer or the $Si_{1-x}Ge_x$ layer.

16. The field effect transistor as claimed in claim 1, wherein the gate electrode is NiSi doped with Sb, and wherein the source region is NiSi.

17. The field effect transistor as claimed in claim 1, wherein the gate electrode is made of NiSi doped with Al, and wherein the source region is NiSi.

18. The field effect transistor as claimed in claim 2, wherein the gate electrode is NiSi doped with Sb, and wherein the source region is NiSi.

19. The field effect transistor as claimed in claim 2, wherein the gate electrode is NiSi doped with Al, and wherein the source region is NiSi.

* * * * *